United States Patent
Qian et al.

(10) Patent No.: US 9,259,821 B2
(45) Date of Patent: Feb. 16, 2016

(54) CHEMICAL MECHANICAL POLISHING LAYER FORMULATION WITH CONDITIONING TOLERANCE

(71) Applicants: Rohm and Haas Electronic Materials CMP Holdings, Inc., Newark, DE (US); Dow Global Technologies LLC, Midland, MI (US)

(72) Inventors: Bainian Qian, Newark, DE (US); Marty W. DeGroot, Middletown, DE (US); Mark F. Sonnenschein, Midland, MI (US)

(73) Assignees: Rohm and Haas Electronic Materials CMP Holdings, Inc., Newark (DE); Dow Global Technologies LLC, Midland, MI (US)

( * ) Notice: Subject to any disclaimer, the term of this patent is extended or adjusted under 35 U.S.C. 154(b) by 0 days.

(21) Appl. No.: 14/314,327

(22) Filed: Jun. 25, 2014

(65) Prior Publication Data
US 2015/0375362 A1  Dec. 31, 2015

(51) Int. Cl.
*B24B 37/24* (2012.01)
*B24B 37/20* (2012.01)
*H01L 21/306* (2006.01)
*G02B 1/12* (2006.01)
*H01F 41/00* (2006.01)

(52) U.S. Cl.
CPC .............. *B24B 37/24* (2013.01); *B24B 37/205* (2013.01); *G02B 1/12* (2013.01); *H01F 41/00* (2013.01); *H01L 21/30625* (2013.01)

(58) Field of Classification Search
None
See application file for complete search history.

(56) References Cited

U.S. PATENT DOCUMENTS

| | | | |
|---|---|---|---|
| 6,325,706 B1 | 12/2001 | Krusell et al. | |
| 6,416,685 B1 | 7/2002 | Zhang et al. | |
| 6,638,143 B2 | 10/2003 | Wang et al. | |
| 6,821,897 B2 | 11/2004 | Schroeder et al. | |
| 7,001,252 B2 | 2/2006 | Hasegawa et al. | |
| 7,040,967 B2 | 5/2006 | Benner | |
| 7,201,641 B2 | 4/2007 | Hasegawa et al. | |
| 8,697,239 B2 | 4/2014 | Kulp et al. | |
| 8,980,749 B1 * | 3/2015 | Itai et al. | 438/692 |
| 2003/0109209 A1 * | 6/2003 | Hishiki | 451/527 |
| 2007/0037491 A1 | 2/2007 | Li et al. | |
| 2008/0034670 A1 | 2/2008 | Li et al. | |
| 2009/0093202 A1 * | 4/2009 | Fukuda et al. | 451/533 |
| 2010/0009612 A1 | 1/2010 | Park et al. | |
| 2010/0029182 A1 * | 2/2010 | Fukuda et al. | 451/41 |
| 2011/0130077 A1 * | 6/2011 | Litke et al. | 451/41 |
| 2014/0342641 A1 * | 11/2014 | Shimizu | 451/41 |
| 2014/0357170 A1 * | 12/2014 | Qian et al. | 451/527 |
| 2014/0378031 A1 * | 12/2014 | Sato et al. | 451/41 |

OTHER PUBLICATIONS

Copending U.S. Appl. No. 14/314,355.

* cited by examiner

*Primary Examiner* — Allan Olsen
(74) *Attorney, Agent, or Firm* — Thomas S. Deibert

(57) ABSTRACT

A chemical mechanical polishing pad is provided containing: a polyurethane polishing layer having a composition and a polishing surface; wherein the polyurethane polishing layer composition exhibits an acid number of ≥0.5 mg (KOH)/g; wherein the polishing surface is adapted for polishing a substrate; and, wherein the polishing surface exhibits a conditioning tolerance of ≥80%.

11 Claims, No Drawings

CHEMICAL MECHANICAL POLISHING LAYER FORMULATION WITH CONDITIONING TOLERANCE

The present invention relates to chemical mechanical polishing pads including a chemical mechanical polyurethane polishing layer with conditioning tolerance and a method of chemical mechanical polishing of a substrate. More particularly, the present invention relates to a chemical mechanical polishing pad comprising a polyurethane polishing layer having a composition and a polishing surface; wherein the polyurethane polishing layer composition exhibits an acid number of ≥0.5 mg (KOH)/g; wherein the polishing surface is adapted for polishing a substrate; and, wherein the polishing surface exhibits a conditioning tolerance of ≥80%.

The production of semiconductors typically involves several chemical mechanical planarization (CMP) processes. In each CMP process, a polishing pad in combination with a polishing solution, such as an abrasive-containing polishing slurry or an abrasive-free reactive liquid, removes excess material in a manner that planarizes or maintains flatness for receipt of a subsequent layer. The stacking of these layers combines in a manner that forms an integrated circuit. The fabrication of these semiconductor devices continues to become more complex due to requirements for devices with higher operating speeds, lower leakage currents and reduced power consumption. In terms of device architecture, this translates to finer feature geometries and increased metallization levels. These increasingly stringent device design requirements are driving the adoption of copper metallization in conjunction with new dielectric materials having lower dielectric constants. The diminished physical properties, frequently associated with low k and ultra-low k materials, in combination with the devices' increased complexity have led to greater demands on CMP consumables, such as polishing pads and polishing solutions.

In particular, low k and ultra-low k dielectrics tend to have lower mechanical strength and poorer adhesion in comparison to conventional dielectrics, rendering planarization more difficult. In addition, as integrated circuits' feature sizes decrease, CMP-induced defectivity, such as, scratching becomes a greater issue. Furthermore, integrated circuits' decreasing film thickness requires improvements in defectivity while simultaneously providing acceptable topography to a wafer substrate—these topography requirements demand increasingly stringent planarity, dishing and erosion specifications.

Polyurethane polishing pads are the primary pad chemistry used for a variety of demanding precision polishing applications. Polyurethane polishing pads are effective for polishing silicon wafers, patterned wafers, flat panel displays and magnetic storage disks. In particular, polyurethane polishing pads provide the mechanical integrity and chemical resistance for most polishing operations used to fabricate integrated circuits. For example, polyurethane polishing pads have high strength for resisting tearing; abrasion resistance for avoiding wear problems during polishing; and stability for resisting attack by strong acidic and strong caustic polishing solutions.

A family of polyurethane polishing layers is disclosed by Kulp et al. in U.S. Pat. No. 8,697,239. Kulp et al. discloses a polishing pad suitable for polishing patterned semiconductor substrates containing at least one of copper, dielectric, barrier and tungsten, the polishing pad comprising a polymeric matrix, the polymeric matrix consisting of a polyurethane reaction product consisting of a polyol blend, a polyamine or polyamine mixture and toluene diisocyanate, the polyol blend being a mixture of 15 to 77 weight percent total polypropylene glycol and polytetramethylene ether glycol and the mixture of polypropylene glycol and polytetramethylene ether glycol having a weight ratio of the polypropylene glycol to the polytetramethylene ether glycol from a 20 to 1 ratio to a 1 to 20 ratio, the polyamine or polyamine mixture being 8 to 50 weight percent in a liquid mixture, and the toluene diisocyanate being 20 to 30 weight percent total toluene diisocyanate monomer or partially reacted toluene diisocyanate monomer, all based on the total weight of the polymeric matrix.

Notwithstanding, there is a continuing need for chemical mechanical polishing pads that exhibit an appropriate balance of properties that provides the desired degree of planarization while minimizing defect formation and which exhibit a high degree of conditioning tolerance.

The present invention provides a chemical mechanical polishing pad, comprising: a polyurethane polishing layer having a composition and a polishing surface; wherein the polyurethane polishing layer composition exhibits an acid number of ≥0.5 mg (KOH)/g; wherein the polishing surface is adapted for polishing a substrate; and, wherein the polishing surface exhibits a conditioning tolerance of ≥80%.

The present invention provides a chemical mechanical polishing pad, comprising: a polyurethane polishing layer having a composition and a polishing surface; wherein the polyurethane polishing layer composition exhibits an acid number of ≥0.5 mg (KOH)/g; wherein the polishing surface is adapted for polishing a substrate, wherein the substrate is selected from the group consisting of at least one of a magnetic substrate, an optical substrate and a semiconductor substrate; and, wherein the polishing surface exhibits a conditioning tolerance of ≥80%.

The present invention provides a chemical mechanical polishing pad, comprising: a polyurethane polishing layer having a composition and a polishing surface; wherein the polyurethane polishing layer composition exhibits an acid number of ≥0.5 mg (KOH)/g; wherein the polishing surface is adapted for polishing a substrate; wherein the polishing surface exhibits a conditioning tolerance of ≥80%; and, wherein the polyurethane polishing layer exhibits a specific gravity of greater than 0.6, a Shore D hardness of 5 to 80 and an elongation to break of 100 to 450%.

The present invention provides a chemical mechanical polishing pad, comprising: a polyurethane polishing layer having a composition and a polishing surface; wherein the polyurethane polishing layer composition is the reaction product of ingredients, comprising: (a) a polyfunctional isocyanate; (b) a curative system, comprising: (i) a carboxylic acid containing polyfunctional curative having an average of at least two active hydrogens and at least one carboxylic acid functional group per molecule; and, (c) optionally, a plurality of microelements; wherein the polyurethane polishing layer composition exhibits an acid number of ≥0.5 mg (KOH)/g; wherein the polishing surface is adapted for polishing a substrate; and, wherein the polishing surface exhibits a conditioning tolerance of ≥80%.

The present invention provides a chemical mechanical polishing pad, comprising: a polyurethane polishing layer having a composition and a polishing surface; wherein the polyurethane polishing layer composition is the reaction product of ingredients, comprising: (a) a polyfunctional isocyanate; (b) a curative system, comprising: (i) a carboxylic acid containing polyfunctional curative having an average of at least two active hydrogens and at least one carboxylic acid functional group per molecule; and, (ii) at least one of: a diamine; a diol; an amine initiated polyol curative; and, a high molecular weight polyol curative having a number average molecular weight, $M_N$, of 2,000 to 100,000 and an average of 3 to 10 hydroxyl groups per molecule; and, (c) optionally, a plurality of microelements; wherein the polyurethane polishing layer composition exhibits an acid number of ≥0.5 mg (KOH)/g; wherein the polishing surface is adapted for polishing a substrate; and, wherein the polishing surface exhibits a conditioning tolerance of ≥80%.

The present invention provides a chemical mechanical polishing pad, comprising: a polyurethane polishing layer having a composition and a polishing surface; wherein the polyurethane polishing layer composition is the reaction product of ingredients, comprising: (a) an isocyanate terminated urethane prepolymer, wherein the isocyanate terminated urethane prepolymer is the reaction product of ingredients, comprising: (i) a polyfunctional isocyanate; and, (ii) a carboxylic acid containing polyfunctional material having an average of at least two active hydrogens and at least one carboxylic acid functional group per molecule; and, (iii) a prepolymer polyol; and, (b) a curative system, comprising at least one polyfunctional curative; and, (c) optionally, a plurality of microelements; wherein the polyurethane polishing layer composition exhibits an acid number of ≥0.5 mg (KOH)/g; wherein the polishing surface is adapted for polishing a substrate; and, wherein the polishing surface exhibits a conditioning tolerance of ≥80%.

The present invention provides a chemical mechanical polishing pad, comprising: a polyurethane polishing layer having a composition and a polishing surface; and, an endpoint detection window; wherein the polyurethane polishing layer composition exhibits an acid number of ≥0.5 mg (KOH)/g; wherein the polishing surface is adapted for polishing a substrate; and, wherein the polishing surface exhibits a conditioning tolerance of ≥80%.

The present invention provides a method of chemical mechanical polishing a substrate, comprising: providing a substrate; selecting a chemical mechanical polishing pad comprising a polyurethane polishing layer having a composition and a polishing surface; wherein the polishing surface is adapted for polishing the substrate; wherein the composition is selected to exhibit an acid number of ≥0.5 mg (KOH)/g; and, wherein the polishing surface exhibits a conditioning tolerance of ≥80%; creating dynamic contact between the polishing surface and the substrate to polish a surface of the substrate; and, conditioning of the polishing surface with an abrasive conditioner.

DETAILED DESCRIPTION

In conventional chemical mechanical polishing processes, the selection of the conditioning disk can be essential to facilitate formation and maintenance of an appropriate texture on the polishing surface of the polyurethane polishing layer of the chemical mechanical polishing pad for polishing. For conventional polyurethane polishing layers, the selection of the conditioning disk has a large impact on the realized removal rate during polishing. That is, conventional polyurethane polishing layers are notorious for having limited conditioning tolerance. Hence, stable removal rates can be difficult to obtain in practice. Applicant has surprisingly found that polyurethane polishing layer compositions selected to exhibit an acid number of ≥0.5 mg (KOH)/g provide a conditioning toleration of ≥80%.

The term "poly(urethane)" as used herein and in the appended claims encompasses (a) polyurethanes formed from the reaction of (i) isocyanates and (ii) polyols (including diols); and, (b) poly(urethane) formed from the reaction of (i) isocyanates with (ii) polyols (including diols) and (iii) water, amines (including diamines and polyamines) or a combination of water and amines (including diamines and polyamines).

The term "acid number" as used herein and in the appended claims in reference to a polyurethane polishing layer composition is a determination of the acidic constituents in the raw material polyols used in forming the polyurethane polishing layer composition expressed as milligrams of potassium hydroxide required to neutralize one gram of the raw materials, mg (KOH)/g, as determined by ASTM Test Method D7253-06 (Reapproved 2011).

The term "conditioning tolerance" as used herein and in the appended claims in reference to the polishing surface of a polyurethane polishing layer is determined according to the following equation:

$$CT = [(TEOS_A / TEOS_M) * 100\%]$$

wherein CT is the conditioning tolerance (in %); $TEOS_A$ is the TEOS removal rate (in Å/min) for the polyurethane polishing layer as measured according to the procedure set forth in the Examples using an aggressive conditioning disk; and, $TEOS_M$ is the TEOS removal rate (in Å/min) for the polyurethane polishing layer as measured according to the procedure set forth in the Examples using a mild conditioning disk.

The chemical mechanical polishing pad of the present invention, comprises: a polyurethane polishing layer having a composition and a polishing surface; wherein the polyurethane polishing layer composition exhibits an acid number of ≥0.5 mg (KOH)/g (preferably, 0.5 to 25 mg (KOH)/g; more preferably, 2.5 to 20 mg (KOH)/g; still more preferably, 5 to 15 mg (KOH)/g; most preferably, 10 to 15 mg (KOH)/g); wherein the polishing surface is adapted for polishing a substrate; and, wherein the polishing surface exhibits a conditioning tolerance of ≥80% (preferably, ≥85%; more preferably, ≥90%; most preferably, ≥95%).

Preferably, chemical mechanical polishing pad of the present invention, comprises: a polyurethane polishing layer having a composition and a polishing surface; wherein the polyurethane polishing layer composition is the reaction product of ingredients, comprising: (a) a polyfunctional isocyanate; (b) a curative system, comprising at least one polyfunctional curative; and, (c) optionally, a plurality of microelements; wherein the polyurethane polishing layer composition exhibits an acid number of ≥0.5 mg (KOH)/g (preferably, 0.5 to 25 mg (KOH)/g; more preferably, 2.5 to 20 mg (KOH)/g; still more preferably, 5 to 15 mg (KOH)/g; most preferably, 10 to 15 mg (KOH)/g); wherein the polishing surface is adapted for polishing a substrate; and, wherein the polishing surface exhibits a conditioning tolerance of ≥80% (preferably, ≥85%; more preferably, ≥90%; most preferably, ≥95%).

The polyurethane polishing layer of the chemical mechanical polishing pad of the present invention has a polishing surface adapted for polishing a substrate. Preferably, the polishing surface is adapted for polishing a substrate selected from at least one of a magnetic substrate, an optical substrate and a semiconductor substrate. More preferably, the polishing surface is adapted for polishing a semiconductor substrate.

Preferably, the polishing surface has macrotexture selected from at least one of perforations and grooves. Perforations can extend from the polishing surface part way or all the way through the thickness of the polyurethane polishing layer. Preferably, grooves are arranged on the polishing surface such that upon rotation of the chemical mechanical polishing pad during polishing, at least one groove sweeps over the surface of the substrate being polished. Preferably, the polishing surface has macrotexture including at least one groove selected from the group consisting of curved grooves, linear grooves and combinations thereof Preferably, polyurethane polishing layer of the chemical mechanical polishing pad of the present invention has a polishing surface adapted for polishing the substrate, wherein the polishing surface has a macrotexture comprising a groove pattern formed therein. Preferably, the groove pattern comprises a plurality of grooves. More preferably, the groove pattern is selected from a groove design. Preferably, the groove design is selected from the group consisting of concentric grooves (which may be circular or spiral), curved grooves, cross hatch grooves (e.g., arranged as an X-Y grid across the pad surface), other regular designs (e.g., hexagons, triangles), tire tread type patterns, irregular designs (e.g., fractal patterns), and combinations thereof. More preferably, the groove design is selected from the group consisting of random grooves, concentric grooves, spiral grooves, cross-hatched grooves, X-Y grid grooves, hexagonal grooves, triangular grooves, fractal grooves and combinations thereof. Most preferably, the polishing surface has a spiral groove pattern formed therein. The groove profile is preferably selected from rectangular with straight side walls or the groove cross section may be "V" shaped, "U" shaped, saw tooth, and combinations thereof.

Preferably, the polyfunctional isocyanate used in the formation of the polyurethane polishing layer of the chemical mechanical polishing pad of the present invention contains an average of at least two reactive isocyanate groups (i.e., NCO) per molecule. More preferably, the polyfunctional isocyanate used in the formation of the polyurethane polishing layer of the chemical mechanical polishing pad of the present invention contains an average of two reactive isocyanate groups (i.e., NCO) per molecule.

Preferably, the polyfunctional isocyanate used in the formation of the polyurethane polishing layer of the chemical mechanical polishing pad of the present invention is selected from the group consisting of an aliphatic polyfunctional isocyanate, an aromatic polyfunctional isocyanate, and a mixture thereof. More preferably, the polyfunctional isocyanate used in the formation of the polyurethane polishing layer of the chemical mechanical polishing pad of the present invention is selected from the group consisting of a diisocyanate selected from the group consisting of 2,4-toluene diisocyanate; 2,6-toluene diisocyanate; 4,4'-diphenylmethane diisocyanate; naphthalene-1,5-diisocyanate; tolidine diisocyanate; para-phenylene diisocyanate; xylylene diisocyanate; isophorone diisocyanate; hexamethylene diisocyanate; 4,4'-dicyclohexylmethane diisocyanate; cyclohexanediisocyanate; and, mixtures thereof. Most preferably, the polyfunctional isocyanate used in the formation of the polyurethane polishing layer of the chemical mechanical polishing pad of the present invention is 4,4'-dicyclohexylmethane diisocyanate.

Preferably, the polyfunctional isocyanate is combined with certain other components to form an isocyanate terminated urethane prepolymer that is then used in the formation of the polyurethane polishing layer of the chemical mechanical polishing pad of the present invention. Preferably, the isocyanate terminated urethane prepolymer used in the formation of the polyurethane polishing layer of the present invention is the reaction product of ingredients, comprising: a polyfunctional isocyanate; and, at least one of (i) a carboxylic acid containing polyfunctional curative having an average of at least two active hydrogens and at least one carboxylic acid functional group per molecule; and, (ii) a prepolymer polyol. More preferably, the isocyanate terminated urethane prepolymer used in the formation of the polyurethane polishing layer of the present invention is the reaction product of ingredients, comprising: a polyfunctional isocyanate; a carboxylic acid containing polyfunctional curative having an average of at least two active hydrogens and at least one carboxylic acid functional group per molecule; and, a prepolymer polyol.

Preferably, the carboxylic acid containing polyfunctional material used to form the isocyanate terminated urethane prepolymer is selected from the group of materials having an average of at least two active hydrogens and at least one carboxylic acid functional group per molecule, wherein the at least one carboxylic acid functional group survives the reaction to form the isocyanate terminated urethane prepolymer. More preferably, the carboxylic acid containing polyfunctional material is selected from the group consisting of (a) materials having an average of two hydroxyl groups and one carboxylic acid functional group per molecule, wherein the at least one carboxylic acid functional group survives the reaction to form the isocyanate terminated urethane prepolymer; and, (b) materials having an average of two active amine hydrogens and one carboxylic acid functional group per molecule, wherein the at least one carboxylic acid functional group survives the reaction to form the isocyanate terminated urethane prepolymer. Still more preferably, the carboxylic acid containing polyfunctional material is selected from the group consisting of materials having an average of two hydroxyl groups and one carboxylic acid functional group per molecule, wherein the at least one carboxylic acid functional group survives the reaction to form the isocyanate terminated urethane prepolymer. Most preferably, the carboxylic acid containing polyfunctional material is selected from the group of materials consisting of linear saturated polyester diols with a pendant carboxylic acid functional group, having the general formula

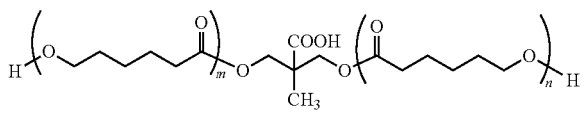

wherein m and n are integers independently selected from the group consisting of 0 to 100 (preferably, 1 to 50; more preferably, 2 to 25; most preferably, 4 to 10).

Prepolymer polyol used in the preparation of the isocyanate terminated urethane prepolymer is preferably selected from the group consisting of diols, polyols, polyol diols, copolymers thereof, and mixtures thereof. Preferably, the prepolymer polyol is selected from the group consisting of polyether polyols (e.g., poly(oxytetramethylene)glycol, poly(oxypropylene)glycol, poly(oxyethylene)glycol); polycarbonate polyols; polyester polyols; polycaprolactone polyols; mixtures thereof; and, mixtures thereof with one or more low molecular weight polyols selected from the group consisting of ethylene glycol (EG); 1,2-propylene glycol; 1,3-propylene glycol; 1,2-butanediol; 1,3-butanediol; 2-methyl-1,3-propanediol; 1,4-butanediol (BDO); neopentyl glycol; 1,5-pentanediol; 3-methyl-1,5-pentanediol; 1,6-hexanediol; diethylene glycol; dipropylene glycol; and, tripropylene glycol. More preferably, the prepolymer polyol is selected from the group consisting of at least one of polycaprolactone polyols; polytetramethylene ether glycol (PTMEG); polypropylene ether glycols (PPG), and polyethylene ether glycols (PEG); optionally, mixed with at least one low molecular weight polyol selected from the group consisting of ethylene glycol (EG); 1,2-propylene glycol; 1,3-propylene glycol; 1,2-butanediol; 1,3-butanediol; 2-methyl-1,3-propanediol; 1,4-butanediol (BDO); neopentyl glycol; 1,5-pentanediol; 3-methyl-1,5-pentanediol; 1,6-hexanediol; diethylene glycol; dipropylene glycol; and, tripropylene glycol. Most preferably, the prepolymer polyol includes at least one of polycaprolactone diol; ethylene glycol (EG); 1,2-propylene glycol; 1,3-propylene glycol; 1,2-butanediol; 1,3-butanediol; 2-methyl-1,3-propanediol; 1,4-butanediol (BDO); neopentyl glycol; 1,5-pentanediol; 3-methyl-1,5-pentanediol; 1,6-hexanediol; diethylene glycol; dipropylene glycol; and, tripropylene glycol.

Preferably, the curative system used in the formation of the polyurethane polishing layer comprises at least one polyfunctional curative. More preferably, the polyfunctional curative is selected from the group consisting of: (i) diamines, (ii) diols, (iii) carboxylic acid containing polyfunctional curatives having an average of at least two active hydrogens and at least one carboxylic acid functional group per molecule; (iv) amine initiated polyol curatives; and, (v) a high molecular weight polyol curatives having a number average molecular weight, $M_N$, of 2,000 to 100,000 and an average of 3 to 10 hydroxyl groups per molecule; and, mixtures thereof.

Preferably, the diamines are selected from the group consisting of diethyltoluenediamine (DETDA); 3,5-dimethylthio-2,4-toluenediamine and isomers thereof; 3,5-diethyltoluene-2,4-diamine and isomers thereof (e.g., 3,5-diethyltoluene-2,6-diamine); 4,4'-bis-(sec-butylamino)-diphenylmethane; 1,4-bis-(sec-butylamino)-benzene; 4,4'-methylene-bis-(2-chloroaniline); 4,4'-methylene-bis-(3-chloro-2,6-diethylaniline) (MCDEA); polytetramethyleneoxide-di-p-aminobenzoate; N,N'-dialkyldiamino diphenyl methane; p,p'-methylene dianiline (MDA); m-phenylenediamine (MPDA); 4,4'-methylene-bis-(2-chloroaniline) (MBOCA); 4,4'-methylene-bis-(2,6-diethylaniline) (MDEA); 4,4'-methylene-bis-(2,3-dichloroaniline) (MDCA); 4,4'-diamino-3,3'-diethyl-5,5'-dimethyl diphenylmethane, 2,2',3,3'-tetrachloro diamino diphenylmethane; trimethylene glycol di-p-aminobenzoate; isomers thereof; diols; and, mixtures thereof. Most preferably, the diamine is 4,4'-methylene-bis-(2-chloroaniline) (MBOCA).

Preferably, the diols are selected from the group consisting of polycaprolactone diol; ethylene glycol (EG); 1,2-propylene glycol; 1,3-propylene glycol; 1,2-butanediol; 1,3-butanediol; 2-methyl-1,3-propanediol; 1,4-butanediol (BDO); neopentyl glycol; 1,5-pentanediol; 3-methyl-1,5-pentanediol; 1,6-hexanediol; diethylene glycol; dipropylene glycol; tripropylene glycol; and, mixtures thereof. More preferably, the diols are selected from the group consisting of polycaprolactone diol; ethylene glycol (EG); 1,2-propylene glycol; 1,3-propylene glycol; 1,2-butanediol; 1,3-butanediol; 2-methyl-1,3-propanediol; 1,4-butanediol (BDO); neopentyl glycol; 1,5-pentanediol; 3-methyl-1,5-pentanediol; 1,6-hexanediol; diethylene glycol; dipropylene glycol; tripropylene glycol; and, mixtures thereof. Most preferably, the diols are selected from the group consisting of polycaprolactone diol; ethylene glycol (EG); 1,2-butanediol; 1,3-butanediol; and, mixtures thereof. Preferably, the polycaprolactone diol is an ethylene glycol initiated polycaprolactone diol. More preferably, the polycaprolactone diol is selected from materials having the general formula

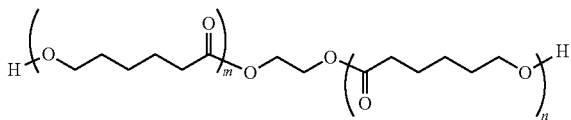

or

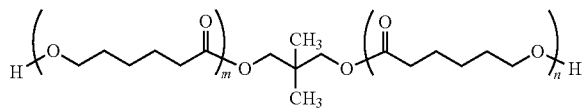

wherein m and n are integers independently selected from the group consisting of 1 to 100 (preferably, 1 to 50; more preferably, 2 to 25; most preferably, 4 to 10). Preferably, the polycaprolactone diol used has a number average molecular weight, $M_N$, of 1,000 to 10,000 (more preferably, 1,000 to 5,000; most preferably, 1,500 to 3,000).

Preferably, the carboxylic acid containing polyfunctional curatives are selected from the group of materials having an average of at least two active hydrogens and at least one carboxylic acid functional group per molecule, wherein the at least one carboxylic acid functional group survives the reaction to form the polyfunctional isocyanate terminated urethane prepolymer. More preferably, the carboxylic acid containing polyfunctional curatives are selected from the group consisting of (a) materials having an average of two hydroxyl groups and one carboxylic acid functional group per molecule, wherein the at least one carboxylic acid functional group survives the reaction to form the polyfunctional isocyanate terminated urethane prepolymer; and, (b) materials having an average of two active amine hydrogens and one carboxylic acid functional group per molecule, wherein the at least one carboxylic acid functional group survives the reaction to form the polyfunctional isocyanate terminated urethane prepolymer. Still more preferably, the carboxylic acid containing polyfunctional curatives are selected from the group consisting of materials having an average of two hydroxyl groups and one carboxylic acid functional group per molecule, wherein the at least one carboxylic acid functional group survives the reaction to form the polyfunctional isocyanate terminated urethane prepolymer. Most preferably, the carboxylic acid containing polyfunctional curatives are selected from the group of materials consisting of linear saturated polyester diols with a pendant carboxylic acid functional group, having the general formula

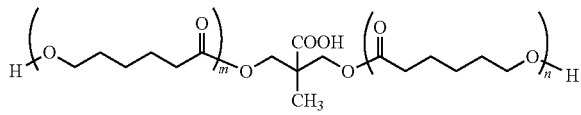

wherein m and n are integers independently selected from the group consisting of 0 to 100 (preferably, 1 to 50; more preferably, 2 to 25; most preferably, 4 to 10).

Preferably, the amine initiated polyol curative contains an average of at least one nitrogen atom (preferably, one to four nitrogen atoms; more preferably, two to four nitrogen atoms; most preferably, two nitrogen atoms) per molecule and an average of at least three (preferably, three to six; more preferably, three to five; most preferably, four) hydroxyl groups per molecule. Preferably, the amine initiated polyol curative has a number average molecular weight, $M_N$, of ≤700 (more preferably, 150 to 650; still more preferably, 200 to 500; most preferably, 250 to 300). The amine initiated polyol curative preferably has a hydroxyl number (as determined by ASTM Test Method D4274-11) of 350 to 1,200 mg KOH/g (more preferably, 400 to 1,000 mg KOH/g; most preferably, 600 to 850 mg KOH/g).

Examples of commercially available amine initiated polyol curatives include the Voranol® family of amine initiated polyols (available from The Dow Chemical Company); the Quadrol® Specialty Polyols (N,N,N',N'-tetrakis(2-hydroxypropyl ethylene diamine))(available from BASF); Pluracol® amine based polyols (available from BASF); Multranol® amine based polyols (available from Bayer MaterialScience LLC); triisopropanolamine (TIPA) (available from The Dow Chemical Company); and, triethanolamine (TEA) (available from Mallinckrodt Baker Inc.). A number of preferred amine initiated polyol curatives are listed in TABLE 1.

TABLE 1

| Amine initiated polyol curative | Number of OH groups per molecule | $M_N$ | Hydroxyl Number (mg KOH/g) |
|---|---|---|---|
| Triethanolamine | 3 | 149 | 1130 |
| Triisopropanolamine | 3 | 192 | 877 |
| MULTRANOL ® 9138 Polyol | 3 | 240 | 700 |
| MULTRANOL ® 9170 Polyol | 3 | 481 | 350 |
| VORANOL ® 391 Polyol | 4 | 568 | 391 |
| VORANOL ® 640 Polyol | 4 | 352 | 638 |
| VORANOL ® 800 Polyol | 4 | 280 | 801 |
| QUADROL ® Polyol | 4 | 292 | 770 |
| MULTRANOL ® 4050 Polyol | 4 | 356 | 630 |
| MULTRANOL ® 4063 Polyol | 4 | 488 | 460 |
| MULTRANOL ® 8114 Polyol | 4 | 568 | 395 |
| MULTRANOL ® 8120 Polyol | 4 | 623 | 360 |
| MULTRANOL ® 9181 Polyol | 4 | 291 | 770 |
| VORANOL ® 202 Polyol | 5 | 590 | 475 |

Preferably, the high molecular weight polyol curative has an average of three to ten (more preferably, four to eight; still more preferably, five to seven; most preferably, six) hydroxyl groups per molecule. Preferably, the high molecular weight polyol curative has a number average molecular weight, $M_N$, of 2,000 to 100,000 (more preferably, 2,500 to 100,000; still more preferably 5,000 to 50,000; most preferably, 7,500 to 15,000).

Examples of commercially available high molecular weight polyol curatives include Specflex® polyols, Voranol® polyols and Voralux® polyols (available from The Dow Chemical Company); Multranol® Specialty Polyols and Ultracel® Flexible Polyols (available from Bayer MaterialScience LLC); and Pluracol® Polyols (available from BASF). A number of preferred high molecular weight polyol curatives are listed in TABLE 2.

TABLE 2

| High molecular weight polyol curative | Number of OH groups per molecule | $M_N$ | Hydroxyl Number (mg KOH/g) |
|---|---|---|---|
| Multranol ® 3901 Polyol | 3.0 | 6,000 | 28 |
| Pluracol ® 1385 Polyol | 3.0 | 3,200 | 50 |
| Pluracol ® 380 Polyol | 3.0 | 6,500 | 25 |
| Pluracol ® 1123 Polyol | 3.0 | 7,000 | 24 |
| ULTRACEL ® 3000 Polyol | 4.0 | 7,500 | 30 |
| SPECFLEX ® NC630 Polyol | 4.2 | 7,602 | 31 |
| SPECFLEX ® NC632 Polyol | 4.7 | 8,225 | 32 |
| VORALUX ® HF 505 Polyol | 6.0 | 11,400 | 30 |
| MULTRANOL ® 9185 Polyol | 6.0 | 3,366 | 100 |
| VORANOL ® 4053 Polyol | 6.9 | 12,420 | 31 |

Preferably, the stoichiometric ratio of the reactive hydrogen groups (i.e., the sum of the amine ($NH_2$) groups and the hydroxyl (OH) groups) in the curative system to the unreacted isocyanate (NCO) groups in the polyfunctional isocyanate is 0.6 to 1.4 (more preferably, 0.80 to 1.30; most preferably, 1.1 to 1.25).

The polyurethane polishing layer composition optionally further comprises a plurality of microelements. Preferably, the plurality of microelements are uniformly dispersed throughout the polyurethane polishing layer. Preferably, the plurality of microelements is selected from entrapped gas bubbles, hollow core polymeric materials, liquid filled hollow core polymeric materials, water soluble materials, an insoluble phase material (e.g., mineral oil) and a combination thereof. More preferably, the plurality of microelements is selected from entrapped gas bubbles and hollow core polymeric materials uniformly distributed throughout the polyurethane polishing layer. Preferably, the plurality of microelements has a weight average diameter of less than 150 µm (more preferably of less than 50 µm; most preferably of 10 to 50 µm). Preferably, the plurality of microelements comprise polymeric microballoons with shell walls of either polyacrylonitrile or a polyacrylonitrile copolymer (e.g., Expancel® from Akzo Nobel). Preferably, the plurality of microelements are incorporated into the polyurethane polishing layer at 0 to 35 vol % porosity (more preferably 10 to 25 vol % porosity).

The polyurethane polishing layer composition used in the chemical mechanical polishing pad of the present invention exhibits an acid number of ≥0.5 mg (KOH)/g. Preferably, the polyurethane polishing layer composition used in the chemical mechanical polishing pad of the present invention exhibits an acid number of 0.5 to 25 mg (KOH)/g (more preferably, 2.5 to 20 mg (KOH)/g; still more preferably, 5 to 15 mg (KOH)/g; most preferably, 10 to 15 mg (KOH)/g).

The polyurethane polishing layer used in the chemical mechanical polishing pad of the present invention preferably has a polishing surface that exhibits a conditioning tolerance of ≥80%. Preferably, the polyurethane polishing layer used in the chemical mechanical polishing pad of the present invention has a polishing surface that exhibits a conditioning tolerance of ≥85% (more preferably, ≥90%; most preferably, ≥95%).

The polyurethane polishing layer can be provided in both porous and nonporous (i.e., unfilled) configurations. Preferably, the polyurethane polishing layer exhibits a specific gravity of greater than 0.6 as measured according to ASTM D1622. More preferably, the polyurethane polishing layer exhibits a specific gravity of 0.6 to 1.5 (still more preferably 0.7 to 1.3; most preferably 0.95 to 1.25) as measured according to ASTM D1622.

Preferably, the polyurethane polishing layer composition a Shore D hardness of 5 to 80 as measured according to ASTM D2240. More preferably, the polyurethane polishing layer exhibits a Shore D hardness of 40 to 80 (more preferably, 50 to 70; most preferably, 60 to 70) as measured according to ASTM D2240.

Preferably, the polyurethane polishing layer exhibits an elongation to break of 100 to 500% as measured according to ASTM D412. Preferably, the polyurethane polishing layer exhibits an elongation to break of 100 to 450% (still more preferably 125 to 450%) as measured according to ASTM D412.

Preferably, the polyurethane polishing layer contains <1 ppm abrasive particles incorporated therein.

The chemical mechanical polishing pad of the present invention is preferably adapted to be interfaced with a platen of a polishing machine. Preferably, the chemical mechanical polishing pad is adapted to be affixed to the platen of the polishing machine. Preferably, the chemical mechanical polishing pad can be affixed to the platen using at least one of a pressure sensitive adhesive and vacuum. Preferably, the chemical mechanical polishing pad of the present invention further comprises a pressure sensitive platen adhesive to facilitate affixing to the platen. One of ordinary skill in the art will know how to select an appropriate pressure sensitive adhesive for use as the pressure sensitive platen adhesive. Preferably, the chemical mechanical polishing pad of the present invention will also include a release liner applied over the pressure sensitive platen adhesive.

The chemical mechanical polishing pad of the present invention optionally further comprises at least one additional layer interfaced with the polishing layer.

An important step in substrate polishing operations is determining an endpoint to the process. One popular in situ method for endpoint detection involves providing a polishing pad with a window, which is transparent to select wavelengths of light. During polishing, a light beam is directed through the window to the wafer surface, where it reflects and passes back through the window to a detector (e.g., a spectrophotometer). Based on the return signal, properties of the substrate surface (e.g., the thickness of films thereon) can be determined for endpoint detection. To facilitate such light based endpoint methods, the chemical mechanical polishing pad of the present invention, optionally further comprises an endpoint detection window. Preferably, the endpoint detection window is selected from an integral window incorporated into the polyurethane polishing layer; and, a plug in place window block incorporated into the chemical mechanical polishing pad. One of ordinary skill in the art will know to select an appropriate material of construction for the endpoint detection window for use in the intended polishing process.

The method of the present invention for chemical mechanical polishing of a substrate comprises: providing a chemical mechanical polishing apparatus having a platen; providing at least one substrate to be polished (preferably, wherein the substrate is selected from the group consisting of at least one of a magnetic substrate, an optical substrate and a semiconductor substrate; more preferable, wherein the substrate is a semiconductor substrate; selecting a chemical mechanical polishing pad of the present invention comprising a polyurethane polishing layer having a composition and a polishing surface; wherein the polishing surface is adapted for polishing the substrate; wherein the composition is selected to exhibit an acid number of ≥0.5 mg (KOH)/g; and, wherein the polishing surface exhibits a conditioning tolerance of ≥80%; most preferably, wherein the substrate is a semiconductor wafer); installing onto the platen the chemical mechanical polishing pad; optionally, providing a polishing medium at an interface between a polishing surface of the chemical mechanical polishing pad and the substrate (preferably, wherein the polishing medium is selected from the group consisting of a polishing slurry and a non-abrasive containing reactive liquid formulation); creating dynamic contact between the polishing surface and the substrate to polish a surface of the substrate, wherein at least some material is removed from the substrate; and, conditioning of the polishing surface with an abrasive conditioner.

Some embodiments of the present invention will now be described in detail in the following Examples.

Comparative Example C and Examples 1-5

Preparation of Polyurethane Polishing Layer

The polyurethane polishing layer according to Comparative Example C was prepared from a cast polyurethane cake prepared by the controlled mixing of (a) the isocyanate terminated urethane prepolymer at 51° C.; (b) the curative system; and, (c) the plurality of microelements (i.e., the Expancel® 551DE20d60 pore former) noted in TABLE 3. The ratio of the isocyanate terminated urethane prepolymer and the curative system was set such that the stoichiometry, as defined by the ratio of active hydrogen groups (i.e., the sum of the —OH groups and —$NH_2$ groups) in the curative system to the unreacted isocyanate (NCO) groups in the isocyanate terminated urethane prepolymer, was as indicated in TABLE 3. The plurality of microelements were mixed into the isocyanate terminated urethane prepolymer prior to the addition of the curative system. The isocyanate terminated urethane prepolymer with the incorporated plurality of microelements and the curative system were then mixed together using a high shear mix head. After exiting the mix head, the combination was dispensed over a period of 5 minutes into a 86.4 cm (34 inch) diameter circular mold to give a total pour thickness of approximately 8 cm (3 inches). The dispensed combination was allowed to gel for 15 minutes before placing the mold in a curing oven. The mold was then cured in the curing oven using the following cycle: 30 minutes ramp of the oven set point temperature from ambient temperature to 104° C., then hold for 15.5 hours with an oven set point temperature of 104° C., and then 2 hour ramp of the oven set point temperature from 104° C. down to 21° C.

The cured polyurethane cake was then removed from the mold and skived (cut using a moving blade) at a temperature of 30 to 80° C. into multiple polyurethane polishing layers of Comparative Example C having an average thickness, $T_{P\text{-}avg}$, of 2.0 mm (80 mil). Skiving was initiated from the top of the cake.

The polyurethane polishing layers according to Examples 1-5 were prepared as single sheets using a drawdown technique. A vortex mixer was used for mixing of (a) the isocyanate terminated prepolymer at 60° C.; (b) the curative system; and, (c) the plurality of microelements (i.e., the Expancel® 551DE20d60 pore former) noted in Table 3 for each of Examples 1-5, respectively. The ratio of the isocyanate terminated urethane prepolymer and the curative system was set such that the stoichiometry, as defined by the ratio of active hydrogen groups (i.e., the sum of the OH groups and $NH_2$¬ groups) in the curative system to the unreacted isocyanate (NCO) groups in the isocyanate terminated urethane prepolymer, was as indicated in TABLE 3. The plurality of microelements were mixed into the isocyanate terminated urethane prepolymer prior to the addition of the curative system. The isocyanate terminated urethane prepolymer with the incorporated plurality of microelements and the curative system were then mixed together using a vortex mixer for 30 seconds. After mixing, the combination was cast into a sheet of approximately 60 by 60 cm (24 by 24 inch) with thickness of approximately 2 mm (80 mil) using a drawdown bar or a doctor blade. The dispensed combination was allowed to gel for 15 minutes before placing the mold in a curing oven. The mold was then cured in the curing oven using the following cycle: 30 minutes ramp of the oven set point temperature from ambient temperature to 104° C., then hold for 15.5 hours with an oven set point temperature of 104° C., and then 2 hour ramp of the oven set point temperature from 104° C. down to 21° C.

Analysis of Polyurethane Polishing Layer Properties

The ungrooved, polyurethane polishing layer material prepared according to Comparative Example C and Examples 1-5 without addition of the pore former (Expancel® material)

were analyzed to determine the physical properties as reported in TABLE 4. Note that the specific gravity reported was determined relative to pure water according to ASTM D1622; the Shore D hardness reported was determined according to ASTM D2240.

The tensile properties of the polyurethane polishing layer (i.e., median tensile strength, median elongation to break, median modulus, toughness) were measured according to ASTM D412 using an Alliance RT/5 mechanical tester available from MTS Systems Corporation as a crosshead speed of 50.8 cm/min. All testing was performed in a temperature and humidity controlled laboratory set at 23° C. and a relative humidity of 50%. All of the test samples were conditioned under the noted laboratory conditions for 5 days before performing the testing. The reported median tensile strength (MPa) and median elongation to break (%) for the polyurethane polishing layer material was determined from stress-strain curves of five replicate samples.

The storage modulus, G', and loss modulus, G", of the polyurethane polishing layer material was measured according to ASTM D5279-08 using a TA Instruments ARES Rheometer with torsion fixtures. Liquid nitrogen that was connected to the instrument was used for sub-ambient temperature control. The linear viscoelastic response of the samples was measured at a test frequency of 10 rad/sec (1.59 Hz) with a temperature ramp of 3° C./min from −100° C. to 200° C. The test samples were stamped out of the polyurethane polishing layer using a 47.5 mm×7 mm die on an Indusco hydraulic swing arm cutting machine and then cut down to approximately 35 mm in length using scissors.

TABLE 3

| Ex # | Polyfunctional Isocyanate | Curative Package (wt %) | | | | | Stoichiometry (Active H/NCO) | Expancel ® Pore Former | Pore Former (wt %) |
| | | Diamines | Diols | | | | | | |
| | | MBOCA | BDO | EG | E | F | | | |
|---|---|---|---|---|---|---|---|---|---|
| C | A | 100 | — | — | — | — | 0.97 | 551DE20d60 | 2.0 |
| 1 | 60/40 wt % Blend of B & D | — | 100 | — | — | — | 0.95 | 551DE20d60 | 2.7 |
| 2 | C | 66.9 | 33.1 | — | — | — | 1.0 | 551DE20d60 | 2.7 |
| 3 | 55.6/44.4 wt % Blend of C & D | — | 100 | — | — | — | 0.95 | 551DE20d60 | 2.7 |
| 4 | D | — | — | 16.6 | 19.2 | 64.3 | 1.0 | 551DE20d60 | 2.4 |
| 5 | D | — | — | 16.6 | 3.9 | 79.5 | 1.0 | 551DE20d60 | 2.4 |

A is an isocyanate terminated urethane prepolymer with a 7.2% NCO comprising a 50/50 weight percent blend of Adiprene ® LFG963A and Adiprene ® LF750D available from Chemtura.
B is an isocyanate terminated urethane prepolymer with a 9.69% NCO formed as the reaction product of 39.4 wt % 4,4'-dicyclohexylmethane diisocyanate and 60.6 wt % of a carboxylic acid containing polyfunctional material having the general formula

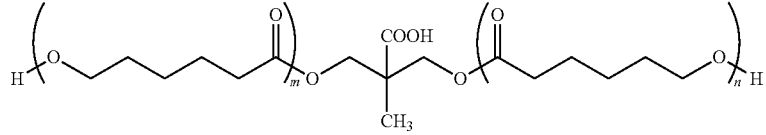

wherein m and n are integers of 4 to 10 (Commercially available from GEO Specialty Chemical as DICAP ® 2020 acid functional saturated polyester polyol).
C is an isocyanate terminated urethane prepolymer with a 9.60% NCO formed as the reaction product of 45.0 wt % 4,4'-dicyclohexylmethane diisocyanate; 51.5 wt % of a polycaprolactone diol having the general formula

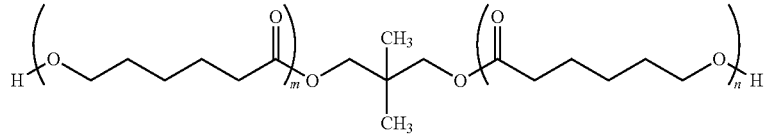

wherein m and n are integers of 4 to 10, wherein the polycaprolactone diol has a number average molecular weight, $M_N$, of 2,000 (Commercially available from The Perstorp Group as CAPA ® 2201A linear polycaprolactone diol); and, 3.4 wt % dimethylolpropionic acid (DMPA).
D is an MDI prepolymer having a 23.0% NCO available from The Dow Chemical Company as Isonate ® 181.
E is a carboxylic acid containing polyfunctional material having the general formula

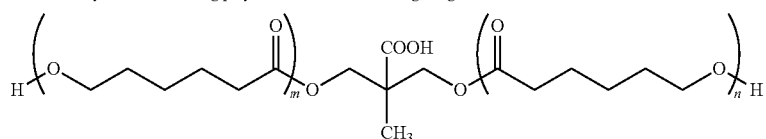

wherein m and n are integers of 4 to 10 (Commercially available from GEO Specialty Chemical as DICAP ® 2020 acid functional saturated polyester polyol).
F is a polycaprolactone diol having the general formula

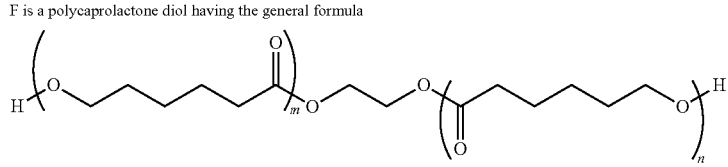

wherein m and n are integers of 10 to 20, wherein the polycaprolactone diol has a number average molecular weight, $M_N$, of 2,000 (Commercially available from The Perstorp Group as CAPA ® 2209 linear polycaprolactone diol).

TABLE 4

| Polishing layer Ex. # | Specific Gravity | Shore D Hardness (15 s) | Tensile strength (MPa) | Elongation to break (%) | G' @ 30° C. (MPa) | G' @ 30° C./G' @ 90° C. | Modulus (MPa) | Toughness (MPa) |
|---|---|---|---|---|---|---|---|---|
| C | 1.15 | 28 | 30.0 | 310 | 142.0 | 2.1 | 215 | 31.9 |
| 1 | 1.14 | 62 | 28.4 | 127 | 200.0 | 7.2 | 263 | 30.1 |
| 2 | 1.14 | 60 | 33.0 | 206 | 145.0 | 8.0 | 295 | 50.6 |
| 3 | 1.13 | 68 | 33.1 | 29 | 264.0 | 12.6 | 535 | 7.4 |
| 4 | 1.21 | 59 | 30.4 | 417 | 118.0 | 3.1 | 189 | 95.9 |
| 5 | 1.21 | 59 | 31.5 | 412 | 133.0 | 2.8 | 191 | 97.7 |

Comparative Example MPC and Examples MP1-MP5

Mild Conditioning Polishing Examples

The polyurethane polishing layers prepared according to Comparative Example C and Examples 1-5 were laminated onto a Suba™ IV subpad (commercially available from Rohm and Haas Electronic Materials CMP Inc.) using a pressure sensitive adhesive for each of Comparative Example MPC and Examples MP1-MP5.

The polishing removal rate experiments were performed on 200 mm blanket 15 k TEOS sheet wafers from Novellus Systems. An Applied Materials 200 mm Mirra® polisher was used. All polishing experiments were performed using a down force of 20.7 kPa (3 psi), a chemical mechanical polishing slurry composition flow rate of 150 ml/min, a table rotation speed of 93 rpm and a carrier rotation speed of 87 rpm. The chemical mechanical polishing slurry composition used was 1:3 dilution of Asahi CES 333F slurry with deionized water and a pH of 5.1. A CS211250-1FN diamond pad conditioner (commercially available from Kinik Company) was used to condition the polishing surface. The polishing surface was broken in with the conditioner using a down force of 7 lbs (3.18 kg) for 40 minutes. The polishing surface was further conditioned in situ during polishing at 10 sweeps/min from 1.7 to 9.2 in from the center of the polishing pad with a down force of 7 lbs (3.18 kg). The removal rates were determined by measuring the film thickness before and after polishing using a KLA-Tencor FX200 metrology tool using a 49 point spiral scan with a 3 mm edge exclusion. The results of the mild conditioning removal rate experiments are provided in TABLE 5.

TABLE 5

| Ex | Polishing layer | TEOS Removal Rate (Å/min) |
|---|---|---|
| MPC | C | 1905 |
| MP1 | 1 | 2542 |
| MP2 | 2 | 2474 |
| MP3 | 3 | 2948 |
| MP4 | 4 | 2260 |
| MP5 | 5 | 2023 |

Comparative Example APC and Examples AP1-AP5

Aggressive Conditioning Polishing Examples

The polyurethane polishing layers prepared according to Comparative Example C and Examples 1-5 were laminated onto a Suba™ IV subpad (commercially available from Rohm and Haas Electronic Materials CMP Inc.) using a pressure sensitive adhesive for each of Comparative Example APC and Examples AP1-AP5.

The polishing removal rate experiments were performed on 200 mm blanket 15 k TEOS sheet wafers from Novellus Systems. An Applied Materials 200 mm Mirra® polisher was used. All polishing experiments were performed using a down force of 20.7 kPa (3 psi), a chemical mechanical polishing slurry composition flow rate of 150 ml/min, a table rotation speed of 93 rpm and a carrier rotation speed of 87 rpm. The chemical mechanical polishing slurry composition used was 1:3 dilution of Asahi CES333F slurry with deionized water and a pH of 5.1. A 8031C1 diamond pad conditioner (commercially available from Saesol Diamond Ind. Co., Ltd.) was used to condition the polishing surface. The polishing surface was broken in with the conditioner using a down force of 7 lbs (3.18 kg) for 40 minutes. The polishing surface was further conditioned in situ during polishing at 10 sweeps/min from 1.7 to 9.2 in from the center of the polishing pad with a down force of 7 lbs (3.18 kg). The removal rates were determined by measuring the film thickness before and after polishing using a KLA-Tencor FX200 metrology tool using a 49 point spiral scan with a 3 mm edge exclusion. The results of the aggressive removal rate experiments are provided in TABLE 6. The conditioning tolerance of the polishing layers calculated from the removal rate experiments are listed in TABLE 7.

TABLE 6

| Ex | Polishing layer | TEOS Removal Rate (Å/min) |
|---|---|---|
| APC | C | 1228 |
| AP1 | 1 | 2382 |
| AP2 | 2 | 2333 |
| AP3 | 3 | 2814 |
| AP4 | 4 | 2011 |
| AP5 | 5 | 1704 |

TABLE 7

| Polishing layer | Conditioning Tolerance (in %) |
|---|---|
| C | 64.5 |
| 1 | 93.7 |
| 2 | 94.3 |
| 3 | 95.5 |
| 4 | 89.0 |
| 5 | 84.2 |

We claim:

1. A chemical mechanical polishing pad, comprising:
a polyurethane polishing layer having a composition and a polishing surface; wherein the composition is the reaction product of ingredients, comprising:

(a) a polyfunctional isocyanate;
(b) a curative system, comprising:
  (i) a carboxylic acid containing polyfunctional curative having an average of at least two active hydrogens and at least one carboxylic acid functional group per molecule, wherein the at least one carboxylic acid functional group survives the reaction to form the composition; and,
(c) optionally, a plurality of microelements;
wherein the composition exhibits an acid number of ≥0.5 mg (KOH)/g; wherein the polishing surface is adapted for polishing a substrate; and, wherein the polishing surface exhibits a conditioning tolerance of ≥80%.

2. The chemical mechanical polishing pad of claim 1, wherein the substrate is selected from the group consisting of at least one of a magnetic substrate, an optical substrate and a semiconductor substrate.

3. The chemical mechanical polishing pad of claim 1, wherein the polyurethane polishing layer exhibits a specific gravity of greater than 0.6; a Shore D hardness of 5 to 80; an elongation to break of 100 to 450%.

4. The chemical mechanical polishing pad of claim 1, wherein the curative system further comprises at least one of:
  a diamine;
  a diol;
  an amine initiated polyol curative; and,
  a high molecular weight polyol curative having a number average molecular weight, $M_N$, of 2,000 to 100,000 and an average of 3 to 10 hydroxyl groups per molecule.

5. The chemical mechanical polishing pad of claim 1, further comprising: an endpoint detection window.

6. The chemical mechanical polishing pad of claim 5, wherein the endpoint detection window is selected from the group consisting of an integral window and a plug in place window.

7. A chemical mechanical polishing pad, comprising:
a polyurethane polishing layer having a composition and a polishing surface, wherein the composition is the reaction product of ingredients, comprising:
  (a) an isocyanate terminated urethane prepolymer, wherein the isocyanate terminated urethane prepolymer is the reaction product of ingredients, comprising:
    (i) a polyfunctional isocyanate; and,
    (ii) a carboxylic acid containing polyfunctional material having an average of at least two active hydrogens and at least one carboxylic acid functional group per molecule, wherein the at least one carboxylic acid functional group survives the reaction to form the isocyanate terminated urethane prepolymer; and,
    (iii) a prepolymer polyol; and,
  (b) a curative system, comprising at least one polyfunctional curative; and,
  (c) optionally, a plurality of microelements
wherein the polyurethane polishing layer composition exhibits an acid number of ≥0.5 mg (KOH)/g; wherein the polishing surface is adapted for polishing a substrate; and, wherein the polishing surface exhibits a conditioning tolerance of ≥80%.

8. A method of chemical mechanical polishing a substrate, comprising:
providing a substrate;
selecting a chemical mechanical polishing pad comprising a polyurethane polishing layer having a composition and a polishing surface; wherein the composition is the reaction product of ingredients, comprising:
  (a) a polyfunctional isocyanate;
  (b) a curative system, comprising:
    (i) a carboxylic acid containing polyfunctional curative having an average of at least two active hydrogens and at least one carboxylic acid functional group per molecule, wherein the at least one carboxylic acid functional group survives the reaction to form the composition; and,
  (c) optionally, a plurality of microelements;
wherein the polishing surface is adapted for polishing the substrate; wherein the composition is selected to exhibit an acid number of ≥0.5 mg (KOH)/g; and, wherein the polishing surface exhibits a conditioning tolerance of ≥80%;
creating dynamic contact between the polishing surface and the substrate to polish a surface of the substrate; and,
conditioning of the polishing surface with an abrasive conditioner.

9. The method of claim 8, wherein the substrate is selected from the group consisting of at least one of a magnetic substrate, an optical substrate and a semiconductor substrate.

10. A method of chemical mechanical polishing a substrate, comprising:
providing a substrate;
selecting a chemical mechanical polishing pad comprising a polyurethane polishing layer having a composition and a polishing surface; wherein the composition is the reaction product of ingredients, comprising:
  (a) an isocyanate terminated urethane prepolymer, wherein the isocyanate terminated urethane prepolymer is the reaction product of ingredients, comprising:
    (i) a polyfunctional isocyanate; and,
    (ii) a carboxylic acid containing polyfunctional material having an average of at least two active hydrogens and at least one carboxylic acid functional group per molecule, wherein the at least one carboxylic acid functional group survives the reaction to form the isocyanate terminated urethane prepolymer; and,
    (iii) a prepolymer polyol; and,
  (b) a curative system, comprising at least one polyfunctional curative; and,
  (c) optionally, a plurality of microelements
wherein the polishing surface is adapted for polishing the substrate; wherein the composition is selected to exhibit an acid number of ≥0.5 mg (KOH)/g; and, wherein the polishing surface exhibits a conditioning tolerance of ≥80%;
creating dynamic contact between the polishing surface and the substrate to polish a surface of the substrate; and,
conditioning of the polishing surface with an abrasive conditioner.

11. The method of claim 10, wherein the substrate is selected from the group consisting of at least one of a magnetic substrate, an optical substrate and a semiconductor substrate.

* * * * *